United States Patent
Liu et al.

(10) Patent No.: US 12,316,296 B2
(45) Date of Patent: May 27, 2025

(54) METHODS RELATED TO GRADIENT RAISED FRAMES IN FILM BULK ACOUSTIC RESONATORS

(71) Applicant: SKYWORKS GLOBAL PTE. LTD., Singapore (SG)

(72) Inventors: Jiansong Liu, Irvine, CA (US); Kwang Jae Shin, Yongin (KR); Jae Hyung Lee, Seoul (KR); Benjamin Paul Abbott, Irvine, CA (US); Chun Sing Lam, San Jose, CA (US)

(73) Assignee: Skyworks Global Pte. Ltd., Singapore (SG)

( * ) Notice: Subject to any disclaimer, the term of this patent is extended or adjusted under 35 U.S.C. 154(b) by 0 days.

(21) Appl. No.: 18/759,178

(22) Filed: Jun. 28, 2024

(65) Prior Publication Data
US 2024/0421793 A1   Dec. 19, 2024

Related U.S. Application Data

(63) Continuation of application No. 17/018,847, filed on Sep. 11, 2020, now Pat. No. 12,028,041.

(60) Provisional application No. 62/900,415, filed on Sep. 13, 2019.

(51) Int. Cl.
| | |
|---|---|
| *H03H 9/02* | (2006.01) |
| *H03H 3/02* | (2006.01) |
| *H03H 9/17* | (2006.01) |
| *H03H 9/56* | (2006.01) |

(52) U.S. Cl.
CPC ............ *H03H 9/0211* (2013.01); *H03H 3/02* (2013.01); *H03H 9/174* (2013.01); *H03H 9/564* (2013.01); *H03H 2003/023* (2013.01); *Y10T 29/42* (2015.01); *Y10T 29/4908* (2015.01)

(58) Field of Classification Search
CPC ........ H03H 9/0211; H03H 9/13; H03H 9/171; H03H 9/54; H03H 3/02; H03H 9/02007; H03H 9/0014; H03H 9/0504; Y10T 29/42; Y10T 29/4908
USPC ............ 29/609, 25.35, 592.1, 594, 729, 757
See application file for complete search history.

(56) References Cited

U.S. PATENT DOCUMENTS

| | | | | |
|---|---|---|---|---|
| 8,797,123 | B2 * | 8/2014 | Burak | H03H 9/585 |
| | | | | 333/191 |
| 9,197,185 | B2 | 11/2015 | Zou et al. | |
| 9,735,754 | B2 * | 8/2017 | Shin | H03H 9/588 |
| 10,284,168 | B2 | 5/2019 | Ivira et al. | |

* cited by examiner

*Primary Examiner* — Thiem D Phan
(74) *Attorney, Agent, or Firm* — Chang & Hale LLP

(57) ABSTRACT

Methods related to gradient raised frames in film bulk acoustic resonators. According to certain aspects, a method for fabricating a film bulk acoustic resonator device can include: forming a first metal layer over a substrate; forming a piezoelectric layer; forming a second metal layer, the piezoelectric layer positioned between the first and second metal layers; and forming a gradient raised frame implemented relative to one of the first and second metal layers and configured to improve reflection of lateral mode waves and to reduce conversion of main mode waves into lateral mode waves.

20 Claims, 14 Drawing Sheets

METHODS RELATED TO GRADIENT RAISED FRAMES IN FILM BULK ACOUSTIC RESONATORS

CROSS-REFERENCE TO RELATED APPLICATION(S)

This application is a continuation of U.S. patent application Ser. No. 17/018,847, filed Sep. 11, 2020, entitled "GRADIENT RAISED FRAMES IN FILM BULK ACOUSTIC RESONATORS," which claims the benefit of U.S. Provisional Application No. 62/900,415, filed on Sep. 13, 2019, entitled "GRADIENT RAISED FRAMES IN FILM BULK ACOUSTIC RESONATORS," each of which is incorporated herein by reference in its entirety.

BACKGROUND

Field

The present disclosure generally relates to bulk acoustic resonators.

Description of the Related Art

A bulk acoustic resonator is a device having a piezoelectric material between two electrodes. When an electromagnetic signal is applied to one of the electrodes, an acoustic wave is generated in the piezoelectric material and propagates to the other electrode.

Depending on the thickness of the piezoelectric material, resonance of such an acoustic wave is established, and on the other electrode, an electromagnetic signal having a frequency corresponding to the resonant acoustic wave is generated. Thus, such a bulk acoustic resonator can be utilized to provide filtering functionality for an electromagnetic signal such as a radio-frequency (RF) signal.

In many applications, the piezoelectric material between the electrodes is relatively thin and implemented as a film. Thus, a bulk acoustic resonator is sometimes referred to as a thin-film bulk acoustic resonator (TFBAR) or as a film bulk acoustic resonator (FBAR).

SUMMARY

According to some implementations, the present disclosure relates to a film bulk acoustic resonator device that includes a substrate, first and second metal layers implemented over the substrate, and a piezoelectric layer between the first and second metal layers. The film bulk acoustic resonator device can also include a gradient raised frame implemented relative to one of the first and second metal layers and configured to improve reflection of lateral mode waves and to reduce conversion of main mode waves into lateral mode waves.

In some embodiments, the gradient raised frame is implemented at a position along a direction perpendicular to the first and second metal layers and the piezoelectric layer.

In some embodiments, the second metal layer is above the piezoelectric layer and the first metal layer is below the piezoelectric layer.

In some embodiments, the gradient raised frame is implemented above the second metal layer.

In some embodiments, the gradient raised frame is implemented below the second metal layer.

In some embodiments, the gradient raised frame has an angle relative to a direction parallel to the first and second metal layers and the piezoelectric layer.

In some embodiments, the angle is less than 90°.

In some embodiments, the gradient raised frame is made of one or more of a heavy material or a low acoustic impedance material.

In some embodiments, the film bulk acoustic resonator device includes a second gradient raised frame implemented relative to one of the first and second metal layers and configured to improve reflection of lateral mode waves and to reduce conversion of main mode waves into lateral mode waves.

In some embodiments, the gradient raised frame is implemented above the second metal layer and the second gradient raised frame is implemented below the second metal layer.

In some embodiments, the gradient raised frame is implemented above the second metal layer and the second gradient raised frame is implemented above the first metal layer.

In some embodiments, the gradient raised frame is implemented below the second metal layer and the second gradient raised frame is implemented below the first metal layer.

In some embodiments, the gradient raised frame and the second gradient raised frame have respective angles relative to a direction parallel to the first and second metal layers and the piezoelectric layer.

In some embodiments, each of the respective angles is less than 90°.

In some embodiments, the gradient raised frame and the second gradient raised frame are made of one or more of a heavy material or a low acoustic impedance material.

In some embodiments, the gradient raised frame is made of a heavy material and the second gradient raised frame is made of a low acoustic impedance material.

In some embodiments, a passivation layer is implemented above the gradient raised frame.

In some embodiments, the passivation layer includes a recessed frame adjacent to an active region.

In some embodiments, the film bulk acoustic resonator device is a radio-frequency filter.

According to some implementations, the present disclosure relates to a method for fabricating a film bulk acoustic resonator device. The method includes forming a first metal layer over a substrate. The method also includes forming a piezoelectric layer. The method further includes forming a second metal layer, the piezoelectric layer positioned between the first and second metal layers. The method additionally includes forming a gradient raised frame implemented relative to one of the first and second metal layers and configured to improve reflection of lateral mode waves and to reduce conversion of main mode waves into lateral mode waves.

In some embodiments, the gradient raised frame is implemented at a position along a direction perpendicular to the first and second metal layers and the piezoelectric layer.

In some embodiments, the second metal layer is above the piezoelectric layer and the first metal layer is below the piezoelectric layer.

In some embodiments, the gradient raised frame has an angle relative to a direction parallel to the first and second metal layers and the piezoelectric layer.

In some embodiments, the angle is less than 90°.

In some embodiments, the method includes forming a second gradient raised frame implemented relative to one of the first and second metal layers and configured to improve reflection of lateral mode waves and to reduce conversion of main mode waves into lateral mode waves.

In some embodiments, the gradient raised frame and the second gradient raised frame have respective angles relative to a direction parallel to the first and second metal layers and the piezoelectric layer.

In some embodiments, each of the respective angles is less than 90°.

According to some implementations, the present disclosure relates to a packaged module that includes a packaging substrate configured to receive a plurality of components. The packaged module can include a film bulk acoustic resonator device including first and second metal layers implemented over a substrate, a piezoelectric layer between the first and second metal layers, and a gradient raised frame implemented relative to one of the first and second metal layers and configured to improve reflection of lateral mode waves and to reduce conversion of main mode waves into lateral mode waves.

In some embodiments, the gradient raised frame is implemented at a position along a direction perpendicular to the first and second metal layers and the piezoelectric layer.

In some embodiments, the second metal layer is above the piezoelectric layer and the first metal layer is below the piezoelectric layer.

In some embodiments, the gradient raised frame has an angle relative to a direction parallel to the first and second metal layers and the piezoelectric layer.

In some embodiments, the angle is less than 90°.

In some embodiments, the film bulk acoustic resonator device includes a second gradient raised frame implemented relative to one of the first and second metal layers and configured to improve reflection of lateral mode waves and to reduce conversion of main mode waves into lateral mode waves.

In some embodiments, the gradient raised frame and the second gradient raised frame have respective angles relative to a direction parallel to the first and second metal layers and the piezoelectric layer.

In some embodiments, each of the respective angles is less than 90°.

According to some implementations, the present disclosure relates to a wireless device that includes an antenna configured to support either or both of transmission and reception of respective signals. The wireless device can include a front-end system in communication with the antenna and including a filter that includes a film bulk acoustic resonator device. The film bulk acoustic resonator device can have a substrate, first and second metal layers implemented over the substrate, and a piezoelectric layer between the first and second metal layers. The film bulk acoustic resonator device can also include a gradient raised frame implemented relative to one of the first and second metal layers and configured to improve reflection of lateral mode waves and to reduce conversion of main mode waves into lateral mode waves.

In some embodiments, the gradient raised frame is implemented at a position along a direction perpendicular to the first and second metal layers and the piezoelectric layer.

In some embodiments, the second metal layer is above the piezoelectric layer and the first metal layer is below the piezoelectric layer.

In some embodiments, the gradient raised frame has an angle relative to a direction parallel to the first and second metal layers and the piezoelectric layer.

In some embodiments, the angle is less than 90°.

In some embodiments, the film bulk acoustic resonator device includes a second gradient raised frame implemented relative to one of the first and second metal layers and configured to improve reflection of lateral mode waves and to reduce conversion of main mode waves into lateral mode waves.

In some embodiments, the gradient raised frame and the second gradient raised frame have respective angles relative to a direction parallel to the first and second metal layers and the piezoelectric layer.

In some embodiments, each of the respective angles is less than 90°.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Described herein are various examples related to film bulk acoustic resonators (FBARs) and related devices having an improved quality factor Q. For example, FBARs and related devices described herein can have increased mode reflection and reduced mode conversion. Although such examples are described in the context of FBARs, it will be understood that one or more features of the present disclosure can also be implemented in other types of resonators, including devices that are similar to FBARs but referred to in different terms.

According to certain aspects, FBARs can include a raised frame in order to improve a quality factor Q above a resonance frequency fs. Generally, in FBARs, leakage of laterally propagating modes out of an active region can cause the quality factor Q to decrease. In addition, mode conversion from the main mode to lateral modes can also cause the quality factor Q to decrease. A raised frame can act as a reflector that reflects lateral modes back to the active region and can improve the quality factor Q. However, having only one raised frame may not be sufficient to reflect all the lateral modes. In order to strengthen the reflection and achieve maximum mode reflection, it can be necessary to form multiple reflectors, such as two or more raised frames, for example, by forming different unmatched acoustic impedance interfaces. However, forming multiple reflectors can create a number of discontinuous boundaries, which can increase mode conversion.

According to certain aspects, FBARs including one or more gradient raised frames can be provided. A gradient raised frame can be efficient in suppressing lateral mode leakage. For example, a gradient raised frame can act as multiple reflectors, which can improve reflection efficiency. As another example, a gradient raised frame can reduce the mode conversion from the main mode to other modes that occurs at discontinuous boundaries. As mentioned above, in addition to mode reflection, mode conversion can also affect the quality factor Q. A gradient raised frame can create quasi-continuous boundaries and suppress mode conversion from the main mode to other modes. In some embodiments, the quality factor Q can be improved significantly at a low gradient taper due to quasi-continuous boundaries and multiple reflections.

Figure 1:
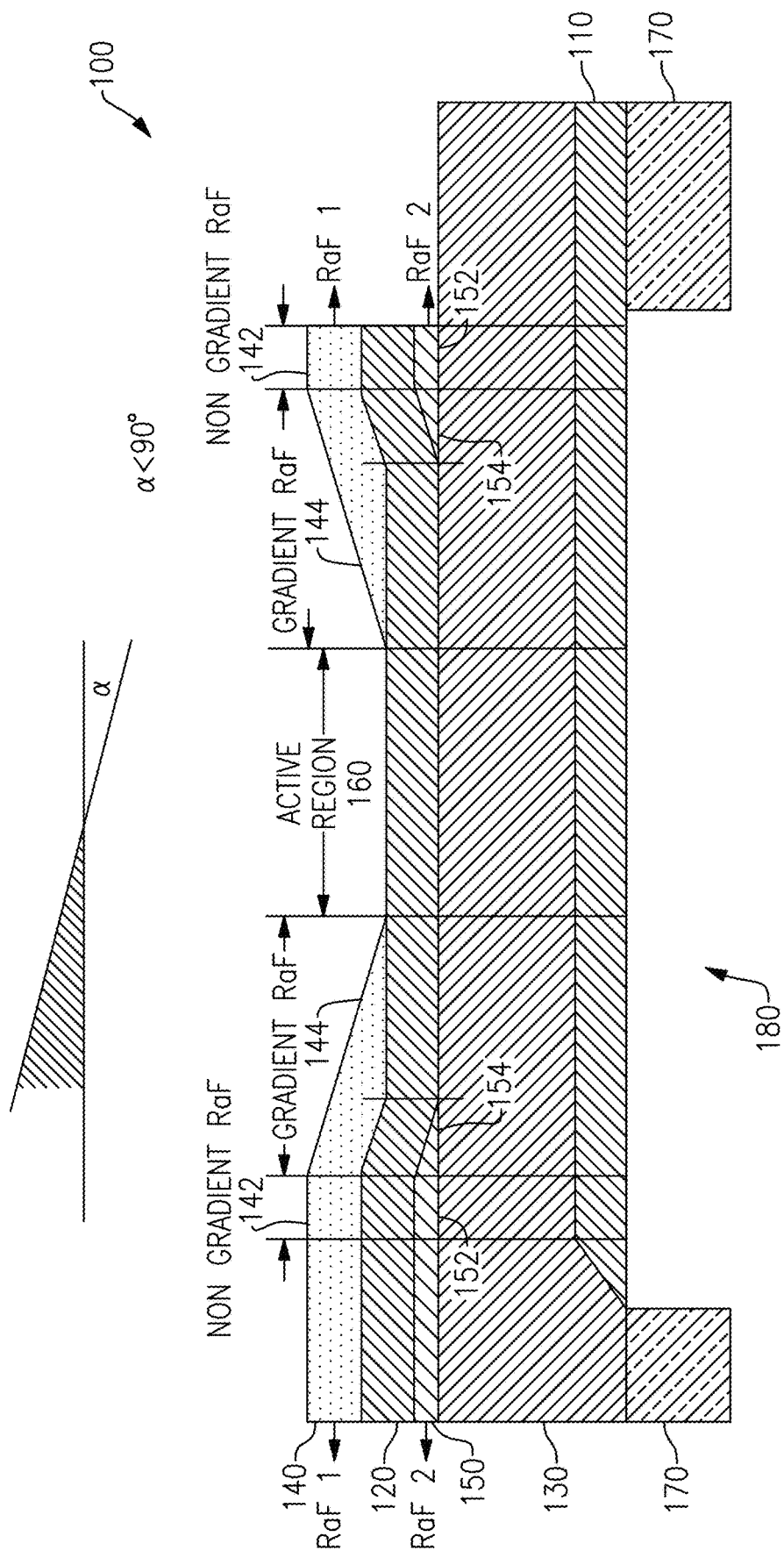
FIG. 1 illustrates a side view of a FBAR device including one or more gradient raised frames.

FIG. 1 illustrates a side view of a FBAR device 100 including one or more gradient raised frames 140, 150. The FBAR device 100 can include a first metal layer 110, a second metal layer 120, and a piezoelectric layer 130 between the first metal layer 110 and the second metal layer 120. A resonator can be formed by positioning the piezoelectric layer 130 between the first metal layer 110 and the second metal layer 120. In some embodiments, a portion of the piezoelectric layer 130 that overlaps with the first metal layer 110 and the second metal layer 120 can be referred to as a "resonator." In some embodiments, a metal layer 110, 120 may be referred to as an "electrode." A radio-frequency (RF) signal can be applied to one of the metal layers 110, 120 and can cause an acoustic wave to be generated in the piezoelectric layer 130. The acoustic wave can travel through the piezoelectric layer 130 and can be converted to an RF signal at the other one of the metal layers 110, 120. In this way, the FBAR device 100 can provide filtering functionality. In the FBAR device 100, acoustic waves can travel in a vertical direction (e.g., perpendicular to the metal layers 110, 120 and the piezoelectric layer 130). For example, the vertical direction can be a Z-direction. Some acoustic waves may travel in a horizontal direction (e.g., parallel to the metal layers 110, 120 and the piezoelectric layer 130). For example, the horizontal direction may be a X-direction, Y-direction, or a combination thereof.

The FBAR device 100 can include one or more gradient raised frames ("RaFs"). In the example of FIG. 1, the FBAR device 100 includes a first RaF 140 and a second RaF 150. For example, the first RaF 140 can be on top of the second metal layer 120, and the second RaF 150 can be below the second metal layer 120, between the second metal layer 120 and the piezoelectric layer 130. Each RaF can include a non-gradient RaF portion and a gradient RaF portion. The gradient RaF portion can have a tapering end and a non-tapering end, and the non-tapering end of the gradient RaF portion can be adjacent to the non-gradient RaF portion. As shown in the example of FIG. 1, a RaF can include a non-gradient RaF portion and a gradient RaF portion on each side of a FBAR device. The first RaF 140 can include a non-gradient RaF portion 142 and a gradient RaF portion 144. The second RaF 150 can include a non-gradient RaF portion 152 and a gradient RaF portion 154. In certain embodiments, a RaF may only include a gradient RaF portion and not include a non-gradient RaF portion. In some embodiments, a gradient RaF portion of a RaF may be referred to as a "gradient RaF." A gradient RaF portion can have an angle α, for example, with respect to the horizontal direction. The angle α may also be referred to as a "taper angle." In some embodiments, the angle α can be less than 90°. In certain embodiments, a gradient RaF portion can have a triangular shape. In other embodiments, a gradient RaF portion can have other polygonal shapes. In some embodiments, the first RaF 140 and the second RaF 150 can have an overlapping region. For example, the gradient RaF portion 144 of the first RaF 140 and the gradient RaF portion 154 of the second RaF 150 can overlap at least in part, for example, in the horizontal direction. The metal layers 110, 120 and the piezoelectric layer 130 can follow the contour or shape of the first RaF 140 and/or the second RaF 150. Accordingly, the metal layers 110, 120 and the piezoelectric layer 130 may include portions that are parallel to the horizontal direction as well as portions that are at an angle with respect to the horizontal direction.

A RaF can be made of or from any suitable material. In some embodiments, a RaF can be made of or from a similar or the same material as the second metal layer 120 and/or the first metal layer 110. For example, a RaF can be made of a heavy material. In certain embodiments, a RaF can be made of or from a low acoustic impedance material. For example, a RaF can be made of silicon dioxide, silicon nitride, etc. A RaF may be made of any low density material. Gradient RaFs can be formed during the manufacturing process for forming a FBAR device (e.g., by deposition process).

In the example of FIG. 1, the FBAR device 100 is shown to include two RaFs for illustrative purposes, but the number of RaFs included in the FBAR device 100 can vary as appropriate, depending on the embodiment. For example, in some embodiments, the FBAR device 100 can include one RaF or more than two RaFs. One or more RaFs can be positioned in various configurations. One or more RaFs can be placed at various positions along the vertical direction (e.g., perpendicular to the metal layers 110, 120 and the piezoelectric layer 130). For example, one or more RaFs can be placed at a position above or below the first metal layer 110, above or below the second metal layer 120, between the first metal layer 110 and the second metal layer 120, or any combination thereof. Various examples of configurations of RaFs are described in more detail below.

Figure 2:
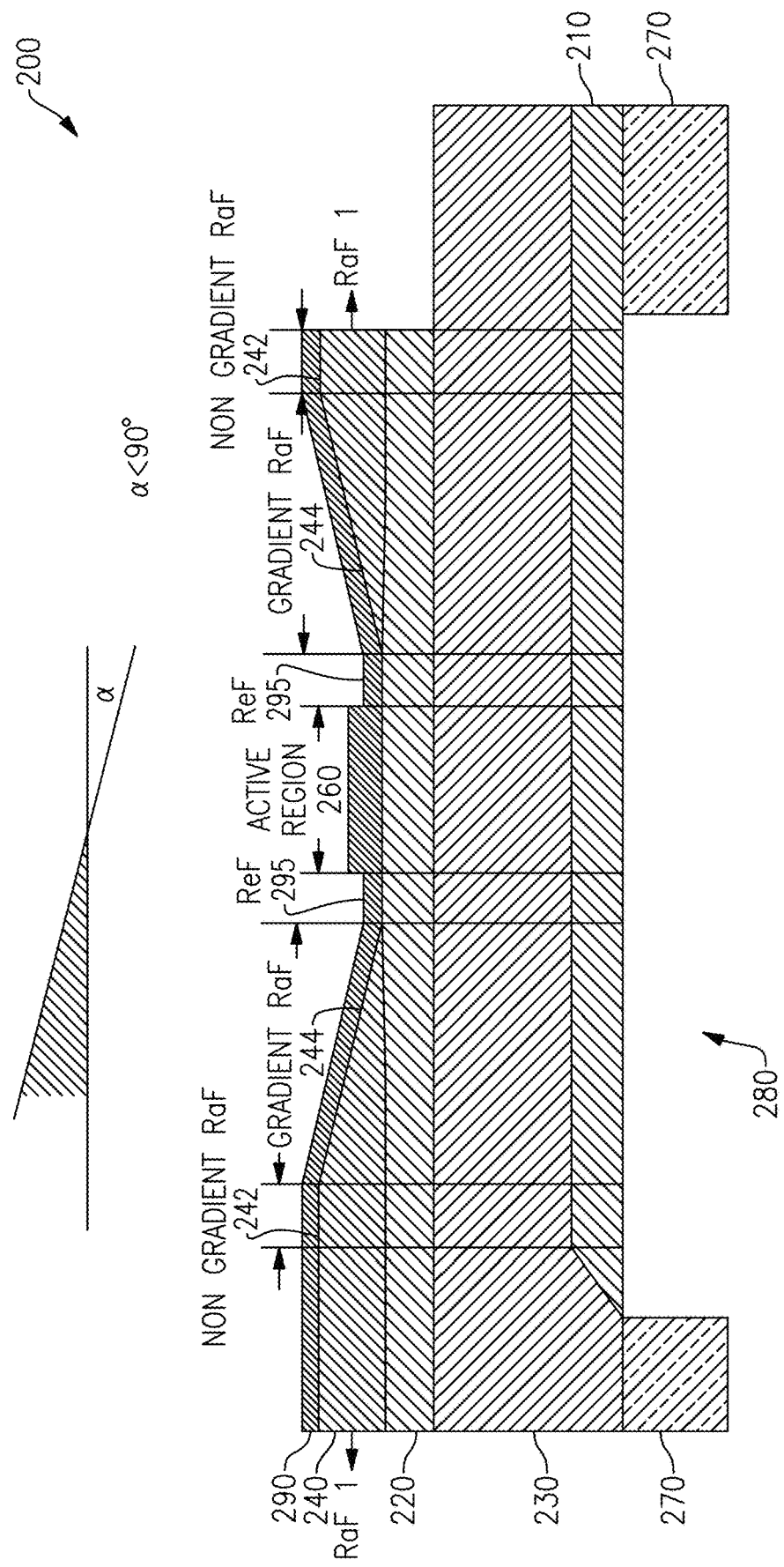
FIG. 2 illustrates a side view of a FBAR device including one gradient raised frame, according to certain embodiments.
Figure 3:
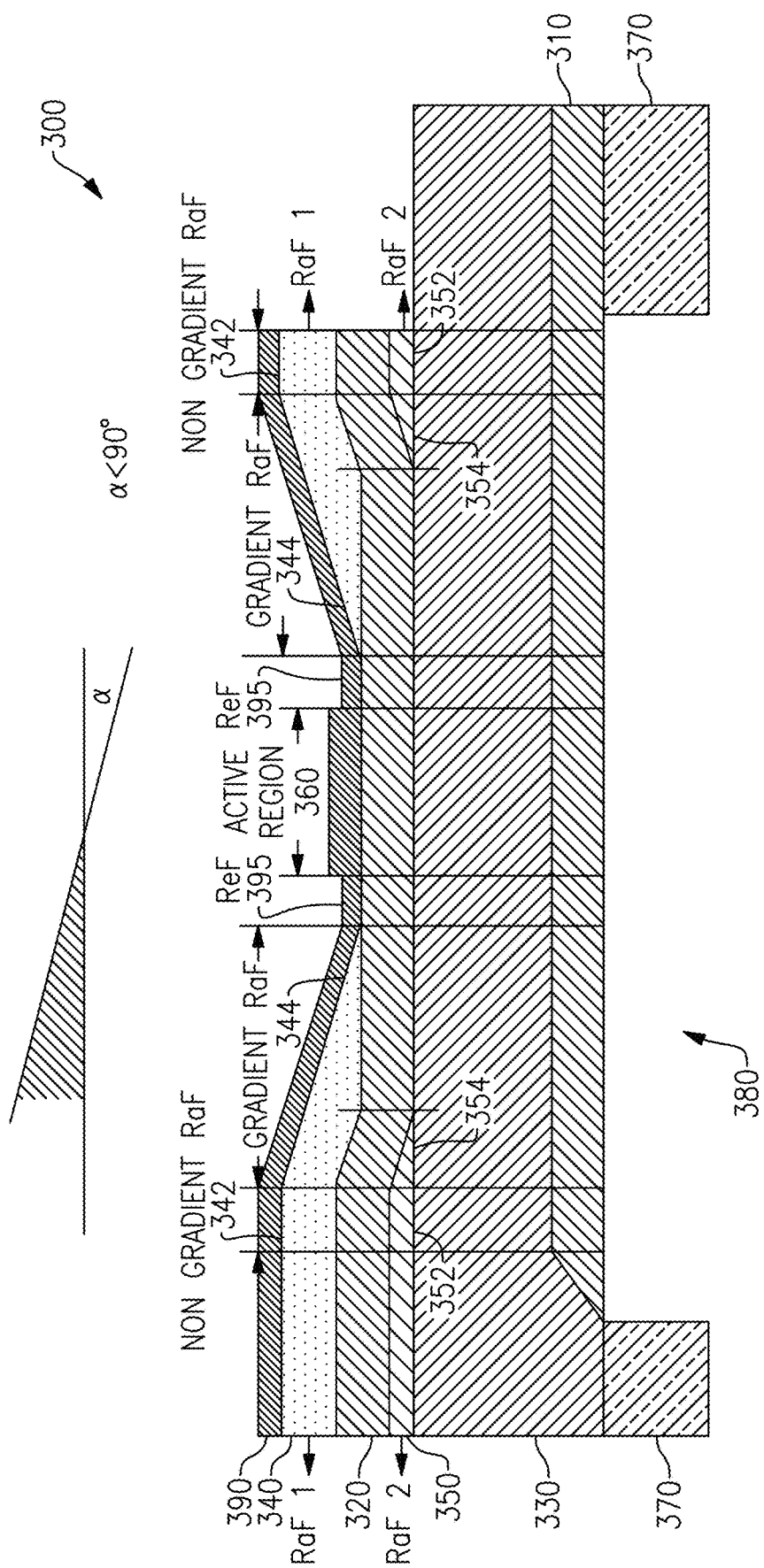
FIG. 3 illustrates a side view of a FBAR device including two gradient raised frames, according to certain embodiments.

The FBAR device 100 can include an active region 160, for example, between the gradient RaF portion 144 of the first RaF 140 on each side of the FBAR device 100. Main mode waves can travel through the active region 160. For instance, the active region 160 can be a preferred region through which main mode waves can travel. Viewed from a top-down perspective, the active region 160 can have a cylindrical shape, a rectangular shape, or other suitable shapes. In some embodiments, the FBAR device 100 can include a passivation layer above the first RaF 140 as shown in FIGS. 2 and 3. In certain embodiments, the FBAR device 100 may also include a recessed frame as shown in FIGS. 2 and 3. In some embodiments, the FBAR device 100 can include a substrate 170 and include an air cavity 180 below the first metal layer 110.

By creating quasi-continuous boundaries, a gradient RaF can increase mode reflection and decrease mode conversion. For example, the quasi-continuous boundaries can act as multiple reflectors to increase mode reflection. The quasi-continuous boundaries can also suppress mode conversion. In this manner, FBAR devices including one or more gradient RaFs can have improved values for the quality factor Q. In some embodiments, lower taper angles for gradient RaFs can be more effective in increasing mode reflection and decreasing mode conversion. For example, the taper angle for a gradient RaF can be less than 45°, 30°, etc. The taper angle can be selected to maximize mode reflection and reduction of mode conversion.

FIG. 2 illustrates a side view of a FBAR device 200 including one gradient raised frame 240, according to certain embodiments. The FBAR device 200 can include a first metal layer 210, a second metal layer 220, and a piezoelectric layer 230 between the first metal layer 210 and the second metal layer 220. In the example of FIG. 2, the FBAR device 200 includes one gradient RaF 240. The RaF 240 can be on top of the second metal layer 220. The RaF 240 can include a non-gradient RaF portion 242 and a gradient RaF portion 244. The gradient RaF portion 244 can have an angle α, for example, with respect to the horizontal direction. In some embodiments, the angle α can be less than 90°. The RaF 240 can be made of or from any suitable material. In certain embodiments, the RaF 240 can be made of or from a similar or the same material as the second metal layer 220. For example, the RaF 240 can be made of a heavy material. In the example of FIG. 2, the lower or bottom edge of the gradient RaF portion 244 can be parallel to the horizontal direction.

In the example of FIG. 2, the FBAR device 200 includes a passivation layer 290. The passivation layer 290 can be on top of the RaF 240 and an exposed portion of the second metal layer 220. The exposed portion of the second metal layer 220 can be a portion that is not covered by the RaF 240. The passivation layer 290 can include an active region 260 and a recessed frame ("ReF") 295. The ReF 295 can be between the gradient RaF portion 244 of the RaF 240 and the active region 260. The ReF 295 can be recessed with respect to the active region 260. For example, the thickness of the ReF 295 may be less than the thickness of the active region 260. The thickness of the ReF 295 can be the same as the thickness of the passivation layer 290 over the non-gradient RaF portion 242 and the gradient RaF portion 244. In some embodiments, the ReF 295 can be a ring structure. In certain embodiments, the ReF 295 and/or the passivation layer 290 may be optional. In some embodiments, the passivation layer 290 can be made of or from silicon dioxide, silicon nitride, etc. The FBAR device 200 can include a substrate 270 and an air cavity 280 below the first metal layer 210.

FIG. 3 illustrates a side view of a FBAR device 300 including two gradient raised frames 340, 350, according to certain embodiments. The FBAR device 300 can include a first metal layer 310, a second metal layer 320, and a piezoelectric layer 330 between the first metal layer 310 and the second metal layer 320. In the example of FIG. 3, the FBAR device 300 includes a first RaF 340 and a second RaF 350. The first RaF 340 can be on top of the second metal layer 320, and the second RaF 350 can be below the second metal layer 320, between the second metal layer 320 and the piezoelectric layer 330. The first RaF 340 can include a non-gradient RaF portion 342 and a gradient RaF portion 344. The gradient RaF portion 344 can have an angle α, for example, with respect to the horizontal direction. In some embodiments, the angle α can be less than 90°. The second RaF 350 can include a non-gradient RaF portion 352 and a gradient RaF portion 354. The gradient RaF portion 354 can also have an angle α, for example, with respect to the horizontal direction. In some embodiments, the angle α can be less than 90°. In certain embodiments, the angle α for the gradient RaF portion 344 and the angle α for the gradient RaF portion 354 can be the same. In other embodiments, the angle α for the gradient RaF portion 344 and the angle α for the gradient RaF portion 354 can be different.

In the example of FIG. 3, the length of the gradient RaF portion 344 is greater than the length of the gradient RaF portion 354. For instance, the gradient RaF portion 344 has a longer weight than the gradient RaF portion 354. The second metal layer 320 can follow the contour of the gradient RaF portion 354. The gradient RaF portion 344 can follow the contour of the second metal layer 320. In the example of FIG. 3, the lower or bottom edge of the gradient RaF portion 344 can include a first portion that is parallel to the upper or top edge of the gradient RaF portion 354 and a second portion that is parallel to the horizontal direction. For example, the first portion of the gradient RaF portion 344 can be at an angle with respect to the horizontal direction. The first portion of the gradient RaF portion 344 can have the same length as the gradient RaF portion 354. The lower or bottom edge of the gradient RaF portion 354 can be parallel to the horizontal direction. In the example of FIG. 3, the length of the non-gradient RaF portion 342 and the length of the non-gradient RaF portion 352 can be the same. The non-gradient RaF portion 342 and the non-gradient RaF portion 352 can be aligned, for example, with respect to the vertical direction. The non-tapering end of the gradient RaF portion 344 and the non-tapering end of the gradient RaF portion 354 can also be aligned. In some embodiments, the length of the non-gradient RaF portion 342 and the length of the non-gradient RaF portion 352 may be different. In certain embodiments, the thickness of the RaF 340 and the thickness of the RaF 350 can be the same. In other embodiments, the thickness of the RaF 340 and the thickness of the RaF 350 can be different.

The first RaF 340 and the second RaF 350 can be made of or from any suitable material. In some embodiments, the first RaF 340 can be made of or from a similar or the same material as the second metal layer 320. For example, the RaF 340 can be made of a heavy material. In some embodiments, the second RaF 350 can be made of or from a low acoustic impedance material. For example, the second RaF 350 can be made of silicon dioxide, silicon nitride, etc. The second RaF 350 may be made of any low density material.

Similar to FIG. 2, the FBAR device 300 includes a passivation layer 390. The passivation layer 390 can be on top of the first RaF 340 and an exposed portion of the second metal layer 320. The exposed portion of the second metal layer 320 can be a portion that is not covered by the RaF 340. The passivation layer 390 can include an active region 360 and a ReF 395. The ReF 395 can be between the gradient RaF portion 344 of the RaF 340 and the active region 360. For example, the thickness of the ReF 395 may be less than the thickness of the active region 360. The ReF 395 can be recessed with respect to the active region 360. The thickness of the ReF 395 can be the same as the thickness of the passivation layer 390 over the non-gradient RaF portion 342 and the gradient RaF portion 344. In some embodiments, the ReF 395 can be a ring structure. In certain embodiments, the recessed frame 395 and/or the passivation layer 390 may be optional. The FBAR device 300 can include a substrate 370 and an air cavity 380 below the first metal layer 310.

Figure 4:
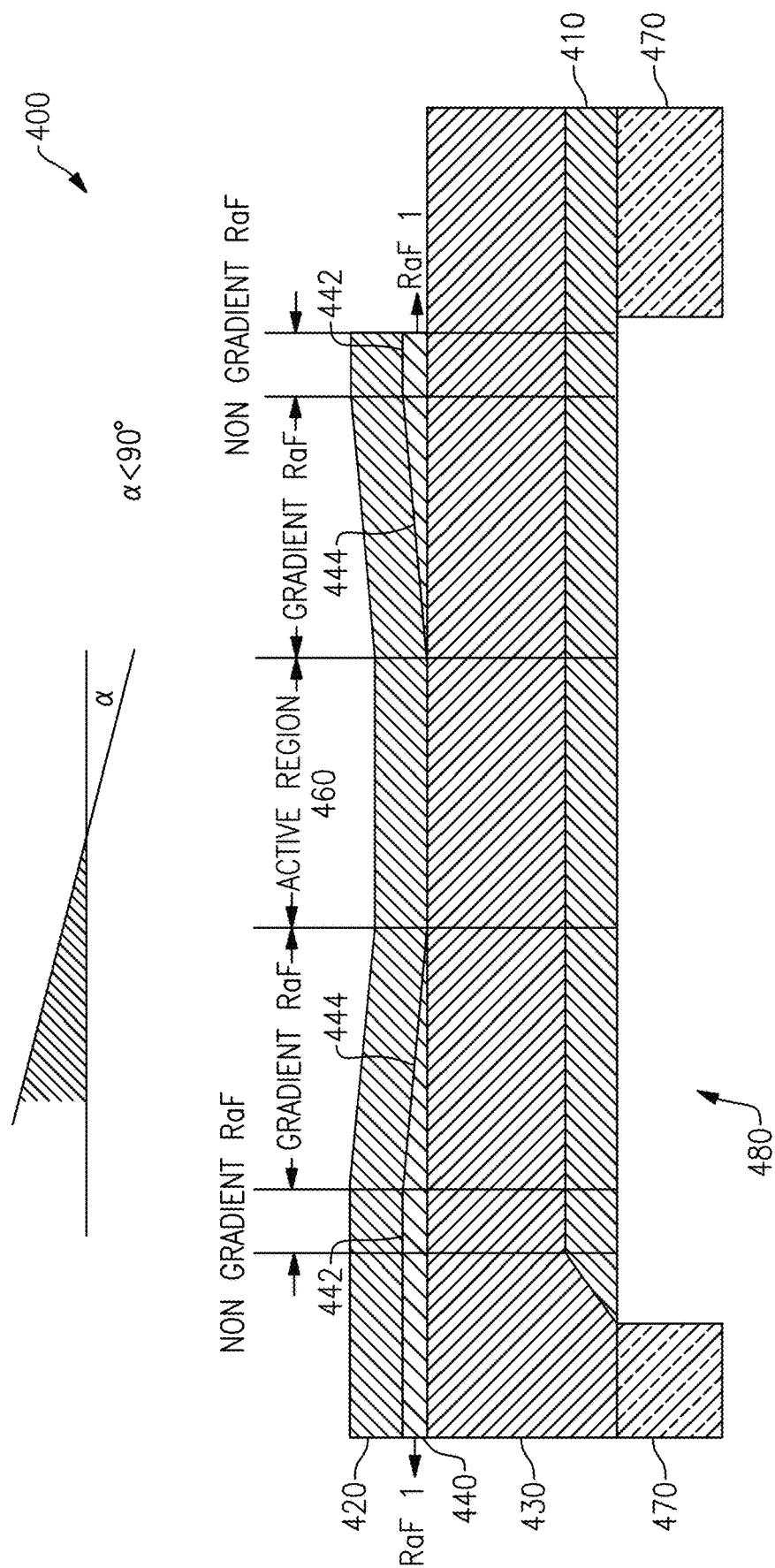
FIG. 4 illustrates a side view of a FBAR device including one gradient raised frame, according to certain embodiments.

FIG. 4 illustrates a side view of a FBAR device 400 including one gradient raised frame 440, according to certain embodiments. The FBAR device 400 can include a first metal layer 410, a second metal layer 420, and a piezoelectric layer 430 between the first metal layer 410 and the second metal layer 420. In the example of FIG. 4, the FBAR device 400 includes one gradient RaF 440. The RaF 440 can be under the second metal layer 420. The RaF 440 can include a non-gradient RaF portion 442 and a gradient RaF portion 444. The gradient RaF portion 444 can have an angle α, for example, with respect to the horizontal direction. In some embodiments, the angle α can be less than 90°. The RaF 440 can be made of or from any suitable material. In some embodiments, the RaF 440 can be made of or from a similar or the same material as the second metal layer 420. For example, the RaF 440 can be made of a heavy material. In certain embodiments, the RaF 440 can be made of or from a low acoustic impedance material. For example, the RaF 440 can be made of silicon dioxide, silicon nitride, etc. The RaF 440 may be made of any low density material. In the example of FIG. 4, the FBAR device 400 does not include a passivation layer or a recessed frame. In other embodiments, a FBAR device can include a passivation layer and/or a recessed frame. The FBAR device 400 can include an active region 460, for example, between the gradient RaF portion 444 of the RaF 440 on each side of the FBAR device 100. The FBAR device 400 can include a substrate 470 and an air cavity 480 below the first metal layer 410. The second metal layer 420 can follow the contour of the gradient RaF portion 444. The lower or bottom edge of the gradient RaF portion 444 can be parallel to the horizontal direction.

Figure 5:
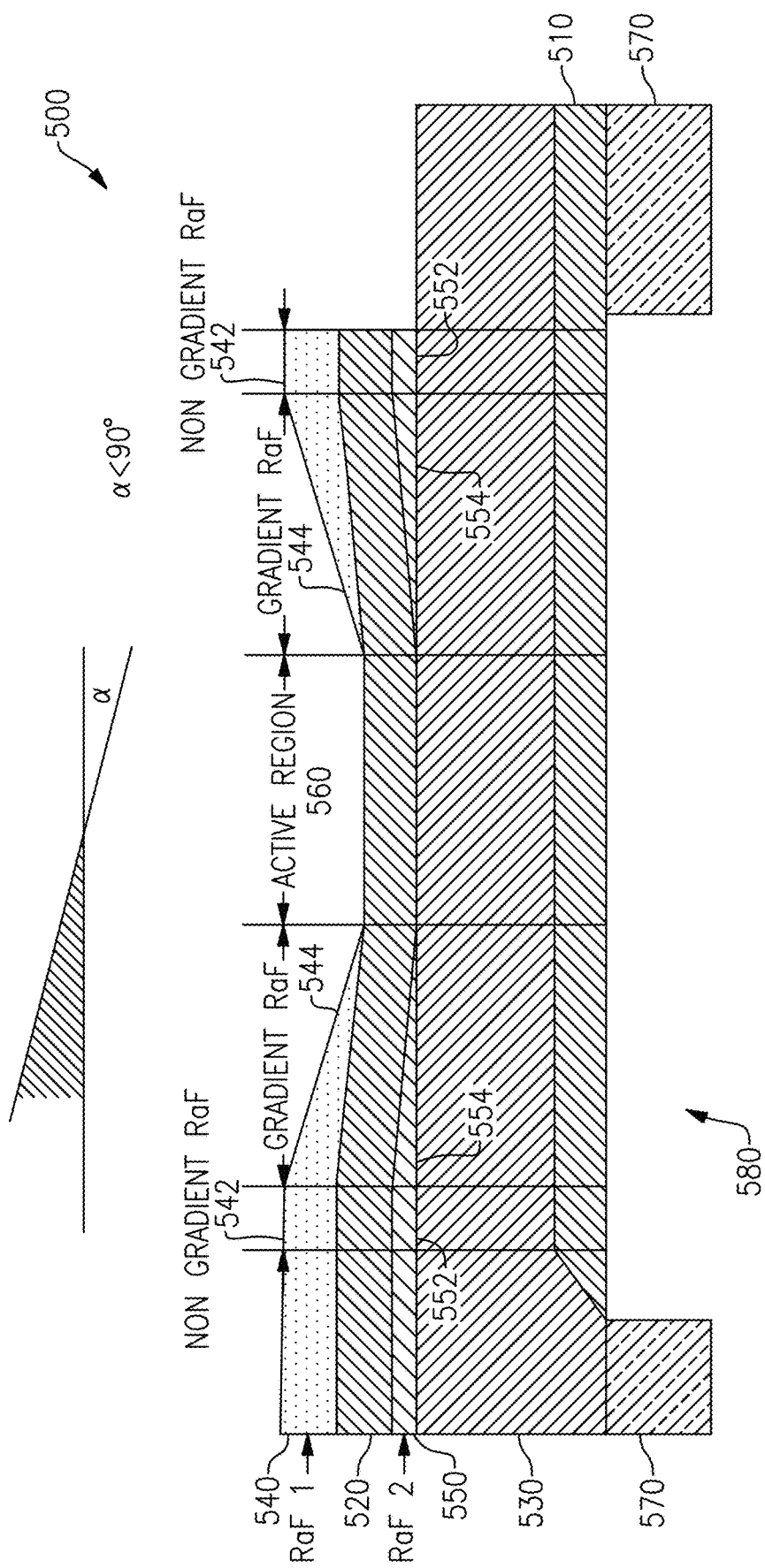
FIG. 5 illustrates a side view of a FBAR device including two gradient raised frames, according to certain embodiments.

FIG. 5 illustrates a side view of a FBAR device 500 including two gradient raised frames 540, 550, according to certain embodiments. The FBAR device 500 can include a first metal layer 510, a second metal layer 520, and a piezoelectric layer 530 between the first metal layer 510 and the second metal layer 520. In the example of FIG. 5, the FBAR device 500 includes a first RaF 540 and a second RaF 550. The first RaF 540 can be on top of the second metal layer 520, and the second RaF 550 can be below the second metal layer 520, between the second metal layer 520 and the piezoelectric layer 530. The first RaF 540 can include a non-gradient RaF portion 542 and a gradient RaF portion 544. The gradient RaF portion 544 can have an angle α, for example, with respect to the horizontal direction. In some embodiments, the angle α can be less than 90°. The second RaF 550 can include a non-gradient RaF portion 552 and a gradient RaF portion 554. The gradient RaF portion 554 can also have an angle α, for example, with respect to the horizontal direction. In some embodiments, the angle α can be less than 90°. In some embodiments, the angle α for the gradient RaF portion 544 and the angle α for the gradient RaF portion 554 can be the same. In other embodiments, the angle α for the gradient RaF portion 544 and the angle α for the gradient RaF portion 554 can be different.

In the example of FIG. 5, the length of the gradient RaF portion 544 and the length of the gradient RaF portion 554 are the same. The second metal layer 520 can follow the contour of the gradient RaF portion 554. The gradient RaF portion 544 can follow the contour of the second metal layer 520. In the example of FIG. 5, the lower or bottom edge of the gradient RaF portion 544 can be parallel to the upper or top edge of the gradient RaF portion 554 and can be at an angle with respect to the horizontal direction. The lower or bottom edge of the gradient RaF portion 554 can be parallel to the horizontal direction. In the example of FIG. 5, the length of the non-gradient RaF portion 542 and the length of the non-gradient RaF portion 552 can be the same. The non-gradient RaF portion 542 and the non-gradient RaF portion 552 can be aligned. The non-tapering end of the gradient RaF portion 544 and the non-tapering end of the gradient RaF portion 554 can also be aligned. In some embodiments, the length of the non-gradient RaF portion 542 and the length of the non-gradient RaF portion 552 can be different. In certain embodiments, the thickness of the RaF 540 and the thickness of the RaF 550 can be the same. In other embodiments, the thickness of the RaF 540 and the thickness of the RaF 550 can be different.

The first RaF 540 and the second RaF 550 can be made of or from any suitable material. In some embodiments, the first RaF 540 can be made of or from a similar or the same material as the second metal layer 520. For example, the RaF 540 can be made of a heavy material. In some embodiments, the second RaF 550 can be made of or from a low acoustic impedance material. For example, the second RaF 550 can be made of silicon dioxide, silicon nitride, etc. The second RaF 550 may be made of any low density material. In the example of FIG. 5, the FBAR device 500 does not include a passivation layer or a recessed frame. In other embodiments, a FBAR device can include a passivation layer and/or a recessed frame. The FBAR device 500 can include an active region 560, for example, between the gradient RaF portion 544 of the first RaF 540 on each side of the FBAR device 500. The FBAR device 500 can include a substrate 570 and an air cavity 580 below the first metal layer 510.

Figure 6:
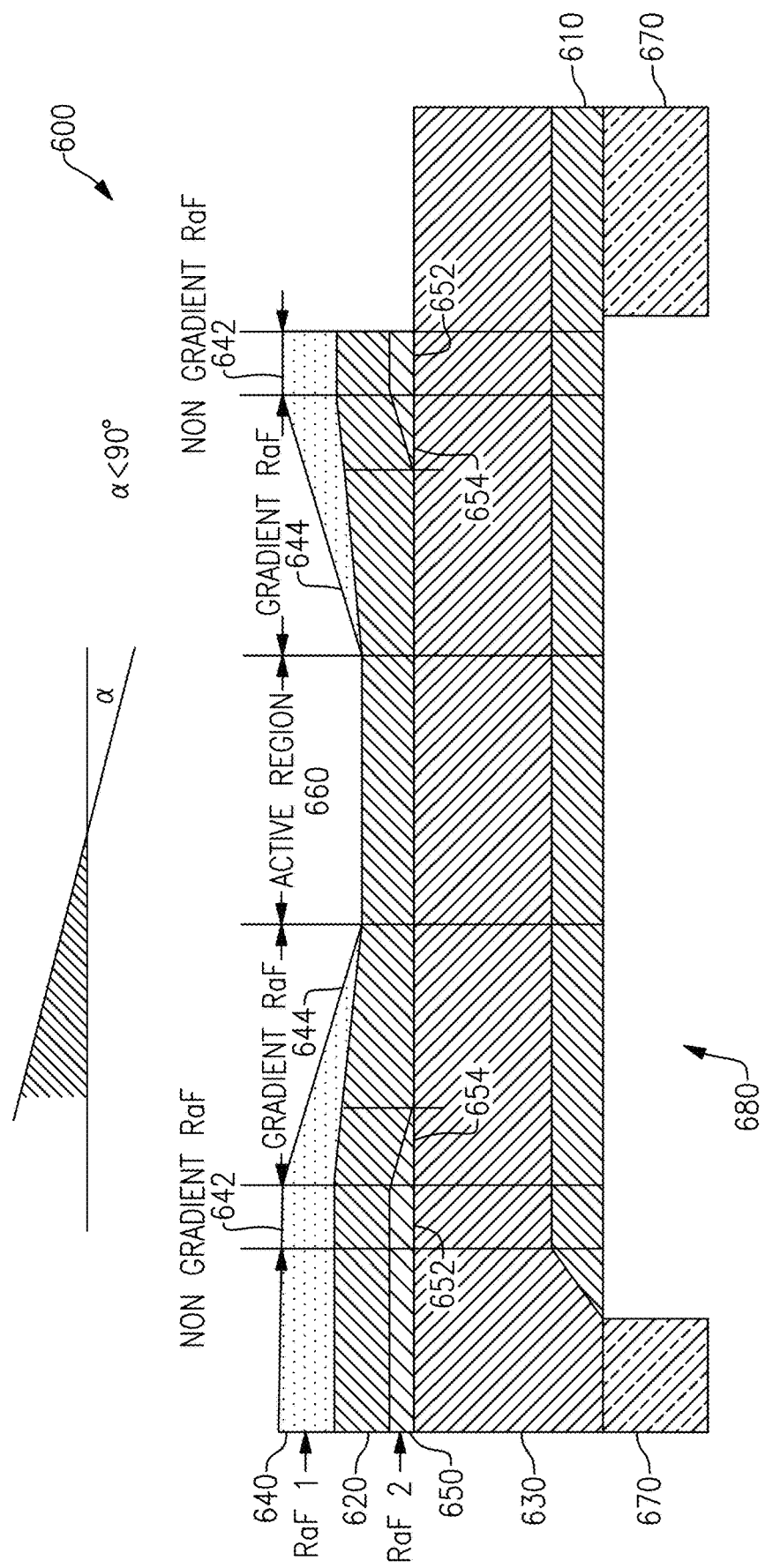
FIG. 6 illustrates a side view of a FBAR device including two gradient raised frames, according to certain embodiments.

FIG. 6 illustrates a side view of a FBAR device 600 including two gradient raised frames 640, 650, according to certain embodiments. The FBAR device 600 can include a first metal layer 610, a second metal layer 620, and a piezoelectric layer 630 between the first metal layer 610 and the second metal layer 620. In the example of FIG. 6, the FBAR device 600 includes a first RaF 640 and a second RaF 650. The first RaF 640 can be on top of the second metal layer 620, and the second RaF 650 can be below the second metal layer 620, between the second metal layer 620 and the piezoelectric layer 630. The first RaF 640 can include a non-gradient RaF portion 642 and a gradient RaF portion 644. The gradient RaF portion 644 can have an angle α, for example, with respect to the horizontal direction. In some embodiments, the angle α can be less than 90°. The second RaF 650 can include a non-gradient RaF portion 652 and a gradient RaF portion 654. The gradient RaF portion 654 can also have an angle α, for example, with respect to the horizontal direction. In some embodiments, the angle α can be less than 90°. In some embodiments, the angle α for the gradient RaF portion 644 and the angle α for the gradient RaF portion 654 can be the same. In other embodiments, the angle α for the gradient RaF portion 644 and the angle α for the gradient RaF portion 654 can be different.

In the example of FIG. 6, the length of the gradient RaF portion 644 is greater than the length of the gradient RaF portion 654. For instance, the gradient RaF portion 644 has a longer weight than the gradient RaF portion 654. The second metal layer 620 can follow the contour of the gradient RaF portion 654. The gradient RaF portion 644 can follow the contour of the second metal layer 620. In the example of FIG. 6, the lower or bottom edge of the gradient RaF portion 644 can be at an angle with respect to the horizontal direction. The lower or bottom edge of the gradient RaF portion 654 can be parallel to the horizontal direction. In the example of FIG. 6, the length of the non-gradient RaF portion 642 and the length of the non-gradient RaF portion 652 can be the same. The non-gradient RaF portion 642 and the non-gradient RaF portion 652 can be aligned. The non-tapering end of the gradient RaF portion 644 and the non-tapering end of the gradient RaF portion 654 can also be aligned. In some embodiments, the length of the non-gradient RaF portion 642 and the length of the non-gradient RaF portion 652 can be different. In certain embodiments, the thickness of the RaF 640 and the thickness of the RaF 650 can be the same. In other embodiments, the thickness of the RaF 640 and the thickness of the RaF 650 can be different.

The first RaF 640 and the second RaF 650 can be made of or from any suitable material. In some embodiments, the first RaF 640 can be made of or from a similar or the same material as the second metal layer 620. For example, the RaF 640 can be made of a heavy material. In some embodiments, the second RaF 650 can be made of or from a low acoustic impedance material. For example, the second RaF 650 can be made of silicon dioxide, silicon nitride, etc. The second RaF 650 may be made of any low density material. In the example of FIG. 6, the FBAR device 600 does not include a passivation layer or a recessed frame. In other embodiments, a FBAR device can include a passivation layer and/or a recessed frame. The FBAR device 600 can include an active region 660, for example, between the gradient RaF portion 644 of the first RaF 640 on each side of the FBAR device 600. The FBAR device 600 can include a substrate 670 and an air cavity 680 below the first metal layer 610.

Figure 7:
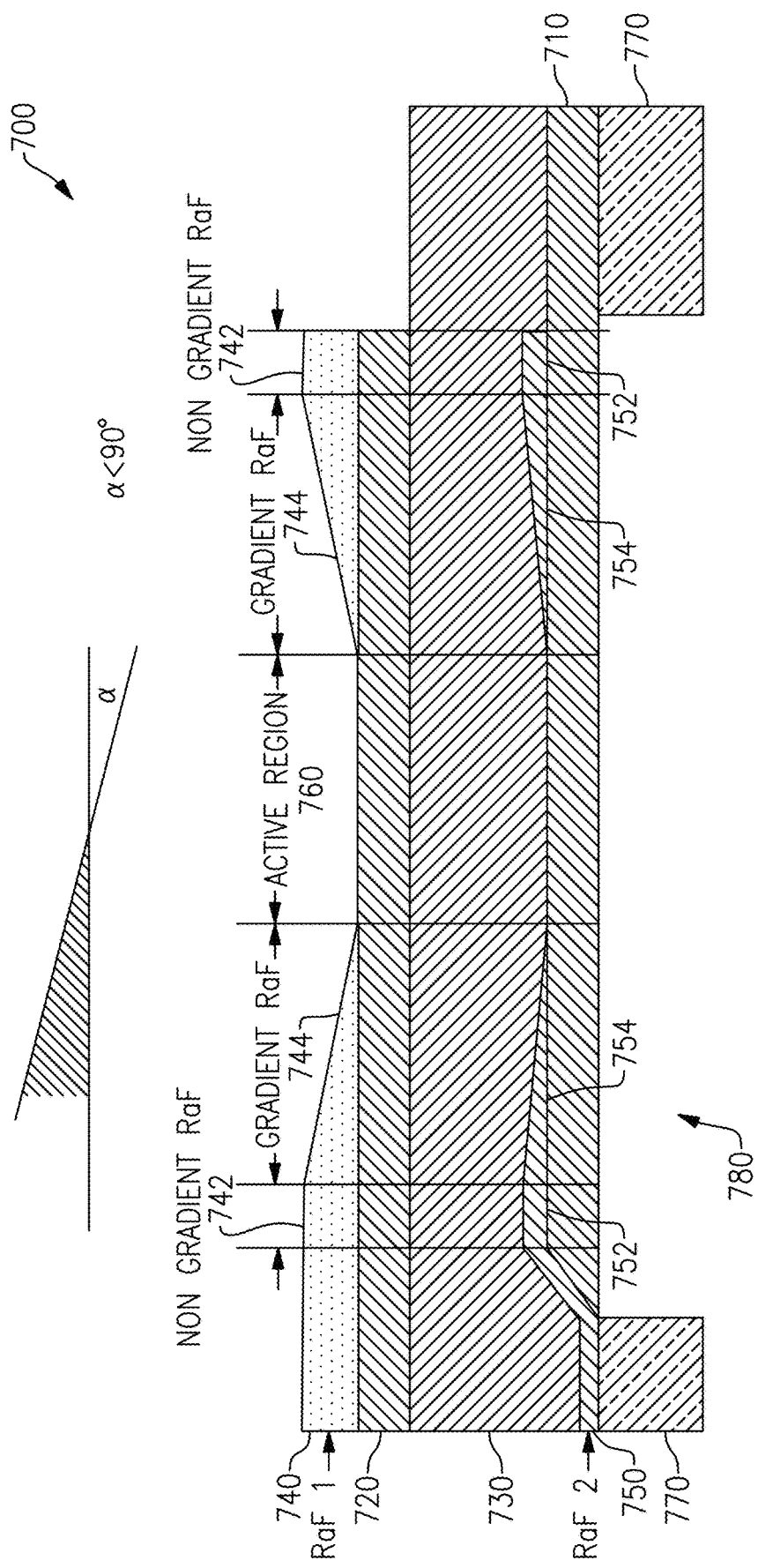
FIG. 7 illustrates a side view of a FBAR device including two gradient raised frames, according to certain embodiments.

FIG. 7 illustrates a side view of a FBAR device 700 including two gradient raised frames 740, 750, according to certain embodiments. The FBAR device 700 can include a first metal layer 710, a second metal layer 720, and a piezoelectric layer 730 between the first metal layer 710 and the second metal layer 720. In the example of FIG. 7, the FBAR device 700 includes a first RaF 740 and a second RaF 750. The first RaF 740 can be on top of the second metal layer 720, and the second RaF 750 can be on top of the first metal layer 710, between the piezoelectric layer 730 and the first metal layer 710. The first RaF 740 can include a non-gradient RaF portion 742 and a gradient RaF portion 744. The gradient RaF portion 744 can have an angle α, for example, with respect to the horizontal direction. In some embodiments, the angle α can be less than 90°. The second RaF 750 can include a non-gradient RaF portion 752 and a gradient RaF portion 754. The gradient RaF portion 754 can also have an angle α, for example, with respect to the horizontal direction. In some embodiments, the angle α can be less than 90°. In some embodiments, the angle α for the gradient RaF portion 744 and the angle α for the gradient RaF portion 754 can be the same. In other embodiments, the angle α for the gradient RaF portion 744 and the angle α for the gradient RaF portion 754 can be different.

In the example of FIG. 7, the length of the gradient RaF portion 744 and the length of the gradient RaF portion 754 are the same. In the example of FIG. 7, the lower or bottom edge of the gradient RaF portion 744 can be parallel to the horizontal direction. The lower or bottom edge of the gradient RaF portion 754 can be parallel to the horizontal direction. The lower or bottom edge of the piezoelectric layer 730 can follow the contour of the second RaF 750. In the example of FIG. 7, the length of the non-gradient RaF portion 742 and the length of the non-gradient RaF portion 752 can be the same. The non-gradient RaF portion 742 and the non-gradient RaF portion 752 can be aligned. The non-tapering end of the gradient RaF portion 744 and the non-tapering end of the gradient RaF portion 754 can also be aligned. In some embodiments, the length of the non-gradient RaF portion 742 and the length of the non-gradient RaF portion 752 can be different. In certain embodiments, the thickness of the RaF 740 and the thickness of the RaF 750 can be the same. In other embodiments, the thickness of the RaF 740 and the thickness of the RaF 750 can be different.

The first RaF 740 and the second RaF 750 can be made of or from any suitable material. In some embodiments, the first RaF 740 can be made of or from a similar or the same material as the second metal layer 720. For example, the RaF 740 can be made of a heavy material. In some embodiments, the second RaF 750 can be made of or from a low acoustic impedance material. For example, the second RaF 750 can be made of silicon dioxide, silicon nitride, etc. The second RaF 750 may be made of any low density material. In certain embodiments, the second RaF 750 can be made of or from a similar or the same material as the second metal layer 720 and/or the first metal layer 710. In the example of FIG. 7, the FBAR device 700 does not include a passivation layer or a recessed frame. In other embodiments, a FBAR device can include a passivation layer and/or a recessed frame. The FBAR device 700 can include an active region 760, for example, between the gradient RaF portion 744 of the first RaF 740 on each side of the FBAR device 700. The FBAR device 700 can include a substrate 770 and an air cavity 780 below the first metal layer 710.

Figure 8:
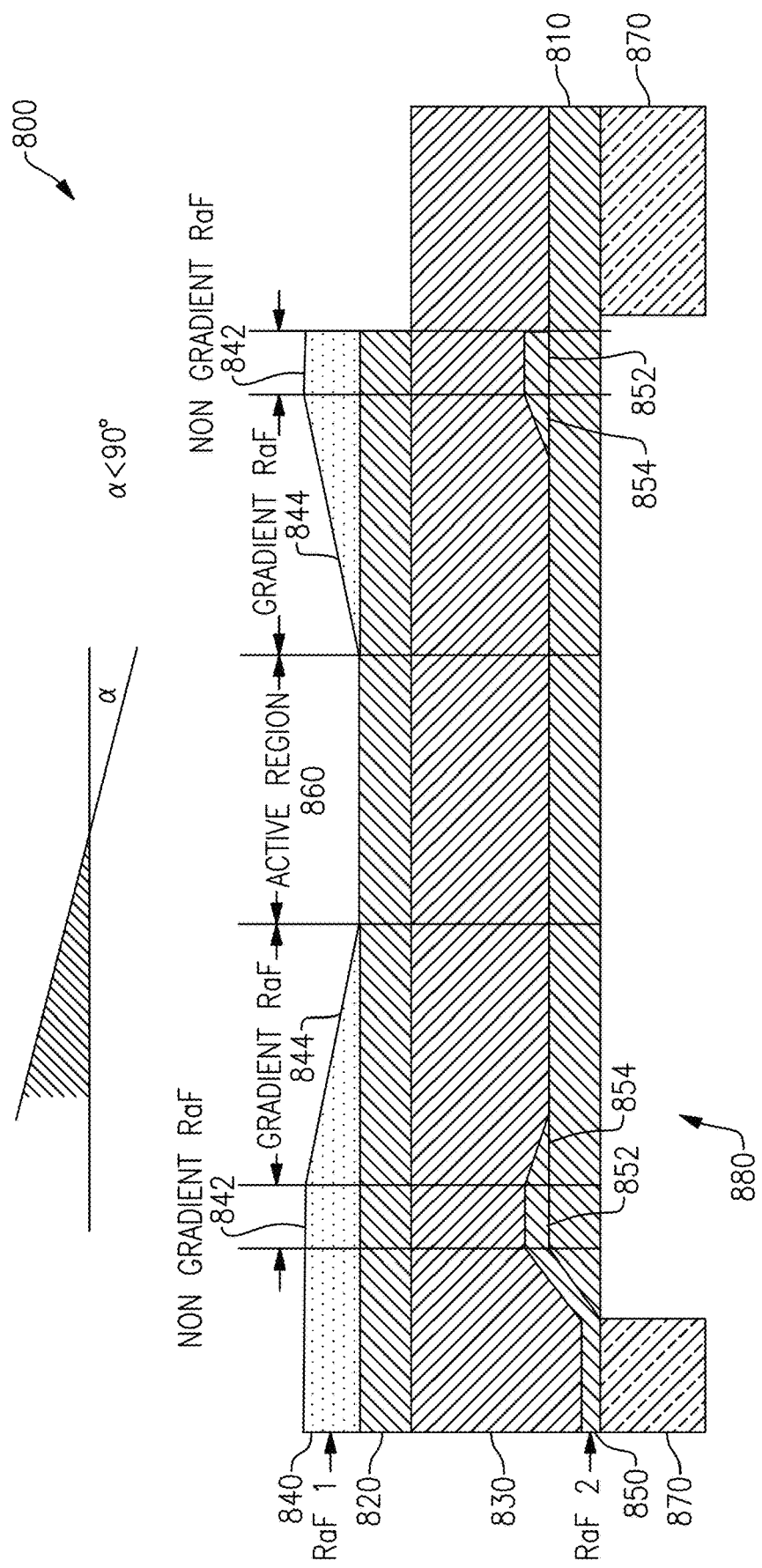
FIG. 8 illustrates a side view of a FBAR device including two gradient raised frames, according to certain embodiments.

FIG. 8 illustrates a side view of a FBAR device 800 including two gradient raised frames 840, 850, according to certain embodiments. The FBAR device 800 can include a first metal layer 810, a second metal layer 820, and a piezoelectric layer 830 between the first metal layer 810 and the second metal layer 820. In the example of FIG. 8, the FBAR device 800 includes a first RaF 840 and a second RaF 850. The first RaF 840 can be on top of the second metal layer 820, and the second RaF 850 can be on top of the first metal layer 810, between the piezoelectric layer 830 and the first metal layer 810. The first RaF 840 can include a non-gradient RaF portion 842 and a gradient RaF portion 844. The gradient RaF portion 844 can have an angle α, for example, with respect to the horizontal direction. In some embodiments, the angle α can be less than 90°. The second RaF 850 can include a non-gradient RaF portion 852 and a gradient RaF portion 854. The gradient RaF portion 854 can also have an angle α, for example, with respect to the horizontal direction. In some embodiments, the angle α can be less than 90°. In some embodiments, the angle α for the gradient RaF portion 844 and the angle α for the gradient RaF portion 854 can be the same. In other embodiments, the angle α for the gradient RaF portion 844 and the angle α for the gradient RaF portion 854 can be different.

In the example of FIG. 8, the length of the gradient RaF portion 844 is greater than the length of the gradient RaF portion 854. For instance, the gradient RaF portion 844 has a longer weight than the gradient RaF portion 854. In the example of FIG. 8, the lower or bottom edge of the gradient RaF portion 844 can be parallel to the horizontal direction. The lower or bottom edge of the gradient RaF portion 854 can be parallel to the horizontal direction. The lower or bottom edge of the piezoelectric layer 830 can follow the contour of the second RaF 850. In the example of FIG. 8, the length of the non-gradient RaF portion 842 and the length of the non-gradient RaF portion 852 can be the same. The non-gradient RaF portion 842 and the non-gradient RaF portion 852 can be aligned. The non-tapering end of the gradient RaF portion 844 and the non-tapering end of the gradient RaF portion 854 can also be aligned. In some embodiments, the length of the non-gradient RaF portion 842 and the length of the non-gradient RaF portion 852 can be different. In certain embodiments, the thickness of the RaF 840 and the thickness of the RaF 850 can be the same. In other embodiments, the thickness of the RaF 840 and the thickness of the RaF 850 can be different.

The first RaF 840 and the second RaF 850 can be made of or from any suitable material. In some embodiments, the first RaF 840 can be made of or from a similar or the same material as the second metal layer 820. For example, the RaF 840 can be made of a heavy material. In some embodiments, the second RaF 850 can be made of or from a low acoustic impedance material. For example, the second RaF 850 can be made of silicon dioxide, silicon nitride, etc. The second RaF 850 may be made of any low density material. In certain embodiments, the second RaF 850 can be made of or from a similar or the same material as the second metal layer 820 and/or the first metal layer 810. In the example of FIG. 8, the FBAR device 800 does not include a passivation layer or a recessed frame. In other embodiments, a FBAR device can include a passivation layer and/or a recessed frame. The FBAR device 800 can include an active region 860, for example, between the gradient RaF portion 844 of the first RaF 840 on each side of the FBAR device 800. The FBAR device 800 can include a substrate 870 and an air cavity 880 below the first metal layer 810.

Figure 9:
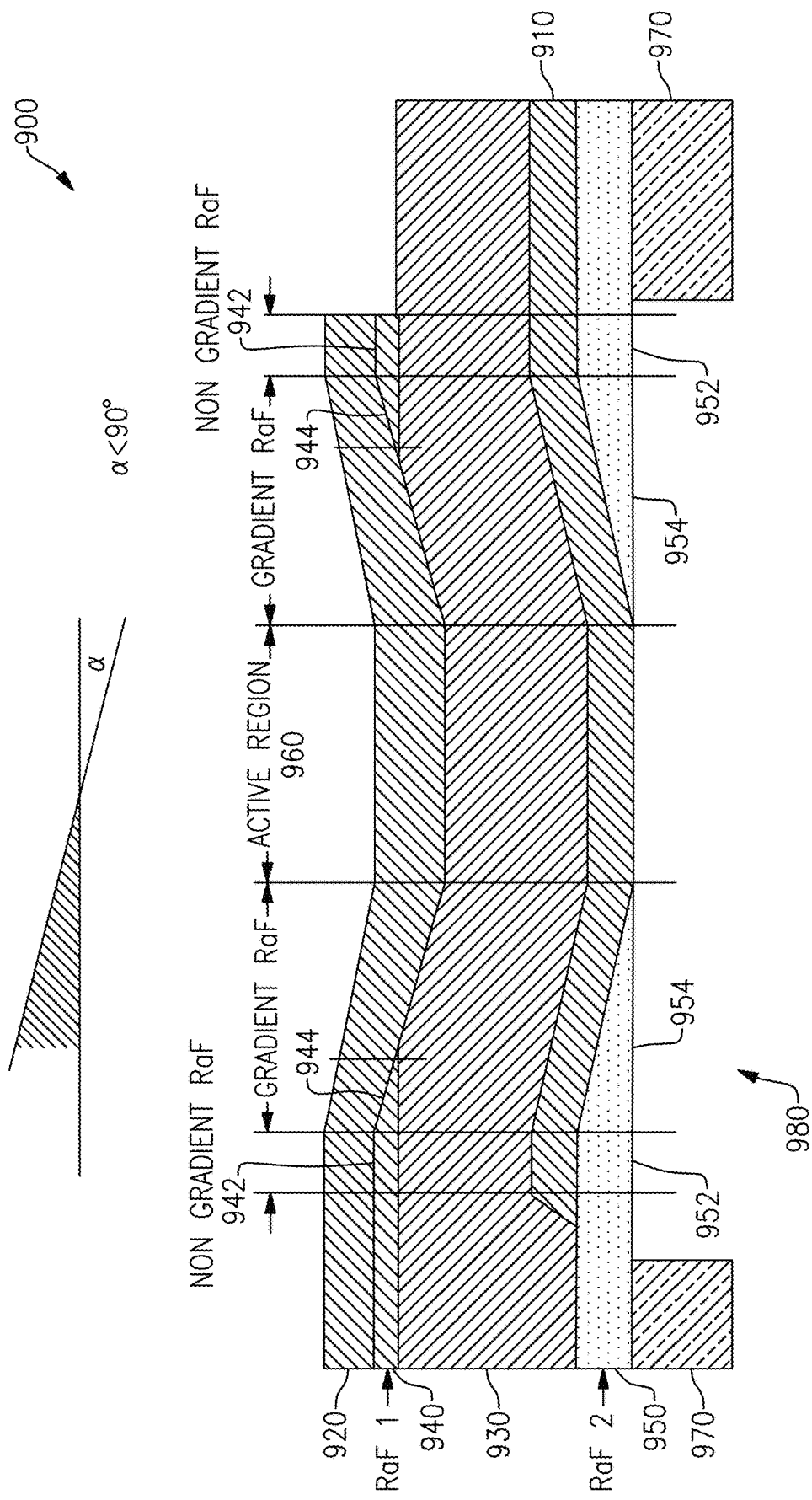
FIG. 9 illustrates a side view of a FBAR device including two gradient raised frames, according to certain embodiments.

FIG. 9 illustrates a side view of a FBAR device 900 including two gradient raised frames 940, 950, according to certain embodiments. The FBAR device 900 can include a first metal layer 910, a second metal layer 920, and a piezoelectric layer 930 between the first metal layer 910 and the second metal layer 920. In the example of FIG. 9, the FBAR device 900 includes a first RaF 940 and a second RaF 950. The first RaF 940 can be below the second metal layer 920, between the second metal layer 910 and the piezoelectric layer 930, and the second RaF 950 can be below the first metal layer 910. The first RaF 940 can include a non-gradient RaF portion 942 and a gradient RaF portion 944. The gradient RaF portion 944 can have an angle α, for example, with respect to the horizontal direction. In some embodiments, the angle α can be less than 90°. The second RaF 950 can include a non-gradient RaF portion 952 and a gradient RaF portion 954. The gradient RaF portion 954 can also have an angle α, for example, with respect to the horizontal direction. In some embodiments, the angle α can be less than 90°. In some embodiments, the angle α for the gradient RaF portion 944 and the angle α for the gradient RaF portion 954 can be the same. In other embodiments, the angle α for the gradient RaF portion 944 and the angle α for the gradient RaF portion 954 can be different.

In the example of FIG. 9, the length of the gradient RaF portion 954 is greater than the length of the gradient RaF portion 944. For instance, the gradient RaF portion 954 has a longer weight than the gradient RaF portion 944. The second metal layer 920 can follow the contour of the gradient RaF portion 944. The first metal layer 910 can follow the contour of the gradient RaF portion 954. The lower or bottom edge of the gradient RaF portion 944 can be parallel to the horizontal direction. The lower or bottom edge of the gradient RaF portion 954 can be parallel to the horizontal direction. The lower or bottom edge of the piezoelectric layer 930 can follow the contour of the first metal layer 910. In the example of FIG. 9, the length of the non-gradient RaF portion 942 and the length of the non-gradient RaF portion 952 can be the same. The non-gradient RaF portion 942 and the non-gradient RaF portion 952 can be aligned. The non-tapering end of the gradient RaF portion 944 and the non-tapering end of the gradient RaF portion 954 can also be aligned. In other embodiments, the length of the non-gradient RaF portion 942 and the length of the non-gradient RaF portion 952 can be different. In some embodiments, the thickness of the RaF 940 and the thickness of the RaF 950 can be the same. In other embodiments, the thickness of the RaF 940 and the thickness of the RaF 950 can be different.

The first RaF 940 and the second RaF 950 can be made of or from any suitable material. In some embodiments, the first RaF 940 can be made of or from a similar or the same material as the second metal layer 920. For example, the RaF 940 can be made of a heavy material. In certain embodiments, the first RaF 940 can be made of or from a low acoustic impedance material. For example, the first RaF 940 can be made of silicon dioxide, silicon nitride, etc. The first RaF 940 may be made of any low density material. In some embodiments, the second RaF 950 can be made of or from a low acoustic impedance material. For example, the second RaF 950 can be made of silicon dioxide, silicon nitride, etc. The second RaF 950 may be made of any low density material. In certain embodiments, the second RaF 950 can be made of or from a similar or the same material as the second metal layer 920 and/or the first metal layer 910. For example, the second RaF 950 can be made of a heavy material. In the example of FIG. 9, the FBAR device 900 does not include a passivation layer or a recessed frame. In other embodiments, a FBAR device can include a passivation layer and/or a recessed frame. The FBAR device 900 can include an active region 960, for example, between the gradient RaF portion 954 of the second RaF 950 on each side of the FBAR device 900. The FBAR device 900 can include a substrate 970 and an air cavity 980 below the first metal layer 910.

Figure 10:
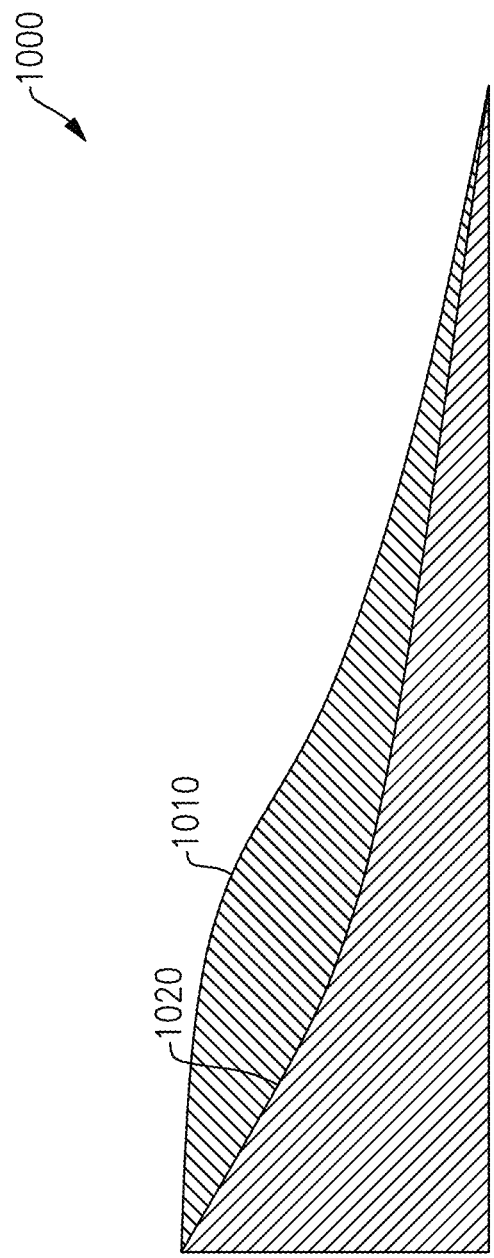
FIG. 10 illustrates examples of non-linear gradient raised frame portions, according to certain embodiments.

FIG. 10 illustrates examples 1000 of non-linear gradient RaF portions, according to certain embodiments. For example, a non-linear gradient can include a convex portion 1010, a concave portion 1020, or any combination thereof. The examples 1000 are provided for illustrative purposes, and many other variations of non-linear gradient RaF portions are possible.

Figure 11:
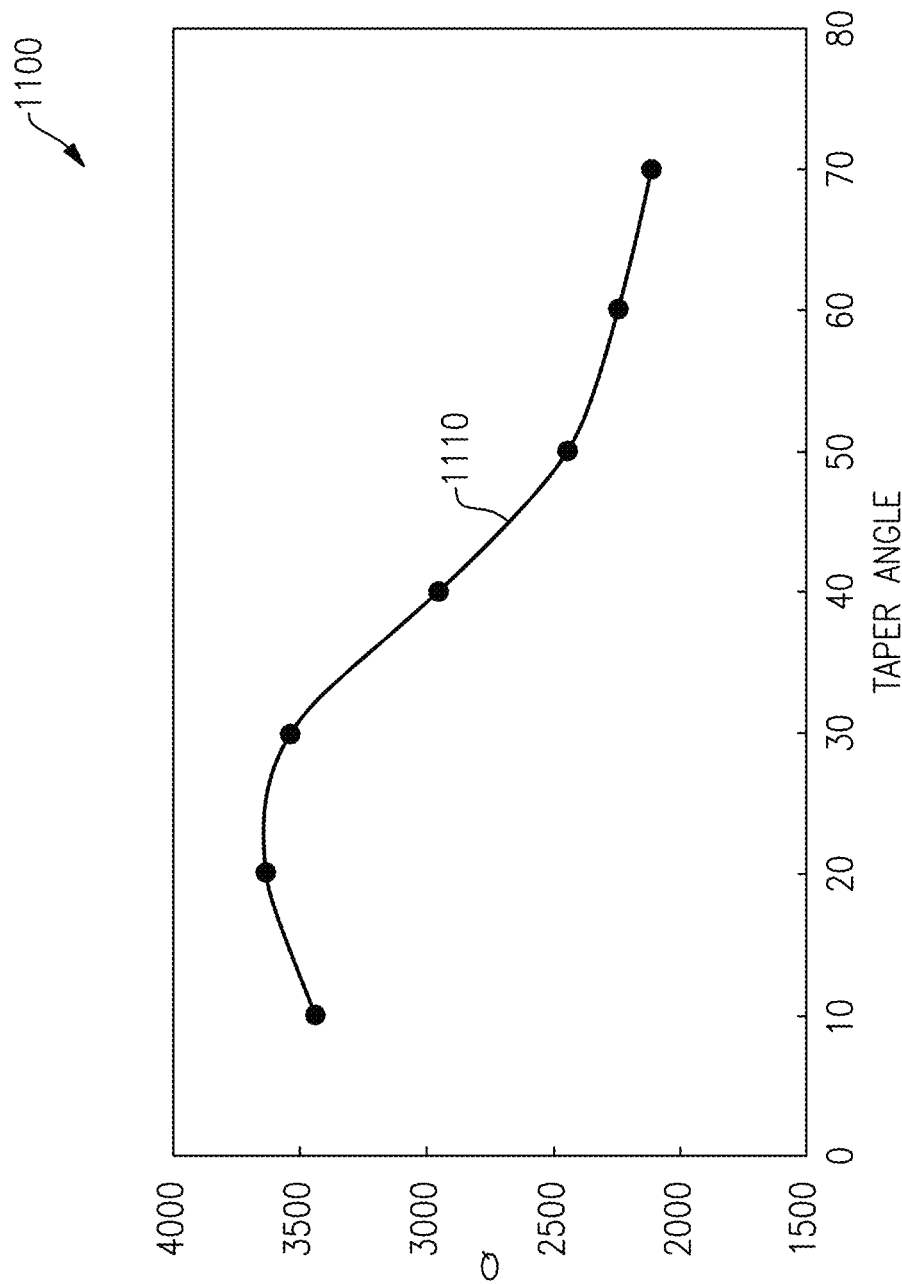
FIG. 11 illustrates a graph, according to certain embodiments.

FIG. 11 illustrates a graph 1100, according to certain embodiments. For example, the graph 1100 can show simulation results for a FBAR device including one gradient RaF, such as the FBAR device 200 illustrated in FIG. 2. The x axis of the graph 1100 can indicate a taper angle of a gradient RaF, and the y axis of the graph 1100 can indicate a quality factor Q for the FBAR device. A line 1110 indicates the value of Q for different taper angles. As shown in FIG. 11, Q has higher values at lower taper angle values. For example, Q values are higher between taper angle of 10° to 30°, and lower between taper angle of 40° and 70°. Accordingly, in some embodiments, a lower taper angle value can be used for a gradient RaF in order to increase the value of Q.

Figure 12:
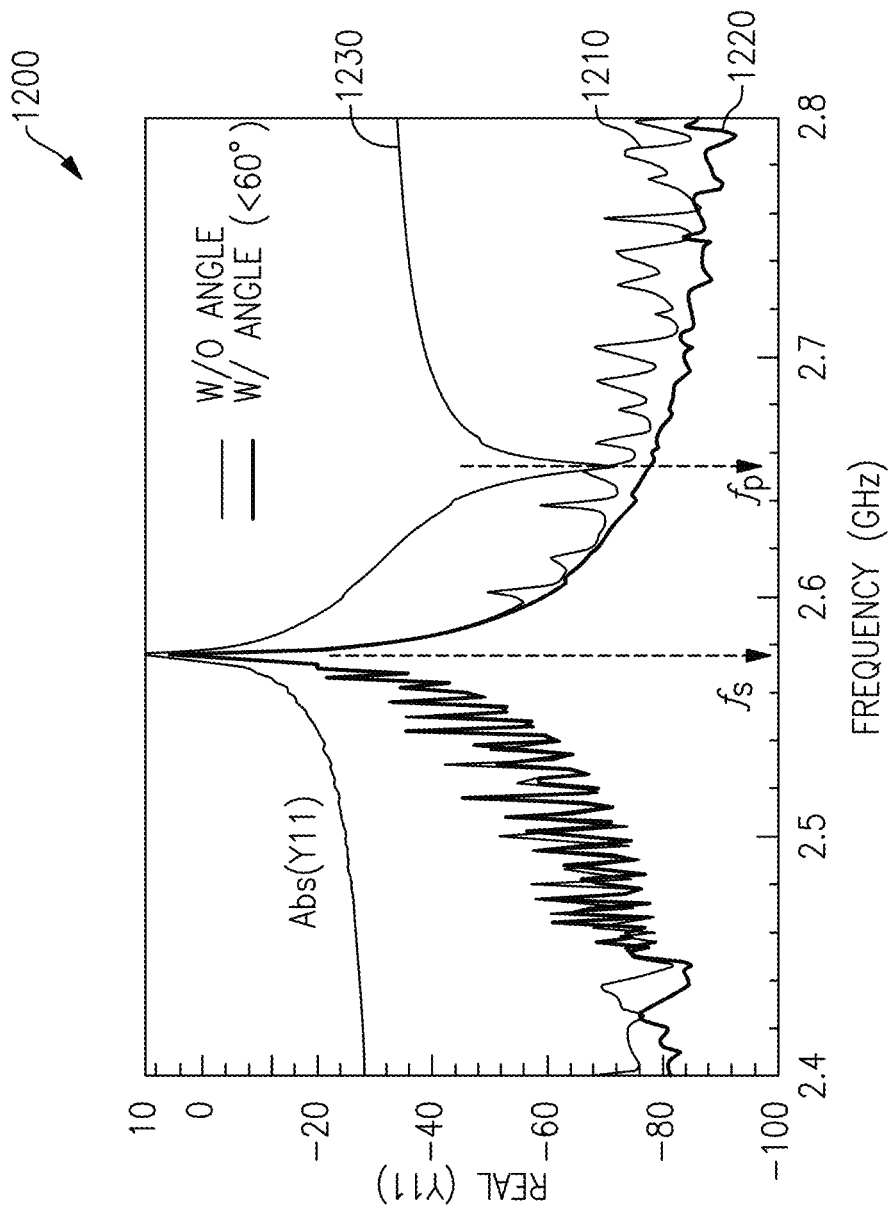
FIG. 12 illustrates a graph, according to certain embodiments.

FIG. 12 illustrates a graph 1200, according to certain embodiments. For example, the graph 1200 can show simulation results for a FBAR device including one gradient RaF, such as the FBAR device 200 illustrated in FIG. 2. The x axis of the graph 1200 indicates frequency, and the y axis of the graph 1200 indicates conductance Y11. A line 1210 can indicate values for a RaF without a gradient. A line 1220 can indicate values for a gradient RaF. For example, the gradient RaF can have an angle of 60° or less. As shown in FIG. 12, significant noise peaks present in plot 1210 (without gradient) in-band (between fs and $f_p$) and out-of-band (higher than $f_p$) are desirably absent or greatly reduced in plot 1220 (with gradient). A line 1230 can indicate absolute values for Y11.

Figure 13:
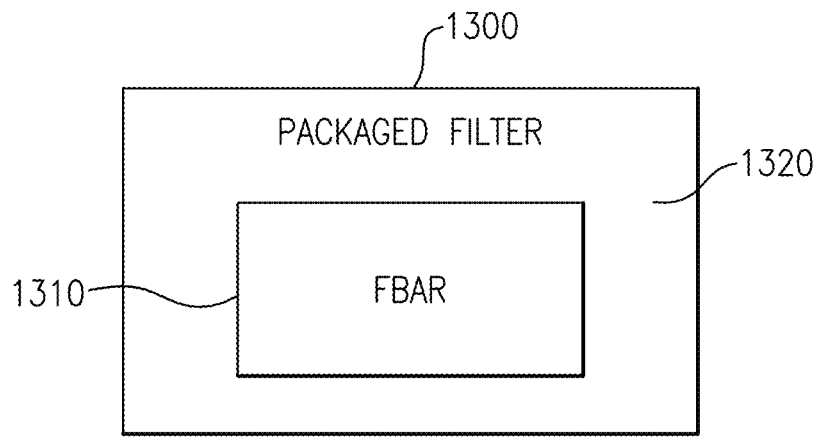
FIG. 13 shows that in some embodiments, a FBAR device having one or more features as described herein can be implemented as, or be part of, a packaged filter.

FIG. 13 shows that a FBAR device 1310 having one or more features as described herein can be implemented as, or be part of, a packaged filter 1300. In some embodiments, such a packaged filter can include a substrate 1320 on configured to support the FBAR functionality. In some embodiments, a FBAR device, such as the example of FIG. 1 (which includes its own substrate 170) can be mounted on another substrate (e.g., the packaging substrate 1320 of FIG. 13). In some embodiments, the substrate 170 of the FBAR device 100 of FIG. 1 can also be the packaging substrate 1320 of FIG. 13. In some embodiments, the packaged filter 1300 of FIG. 13 can be configured to provide radio-frequency (RF) operation.

Figure 14:
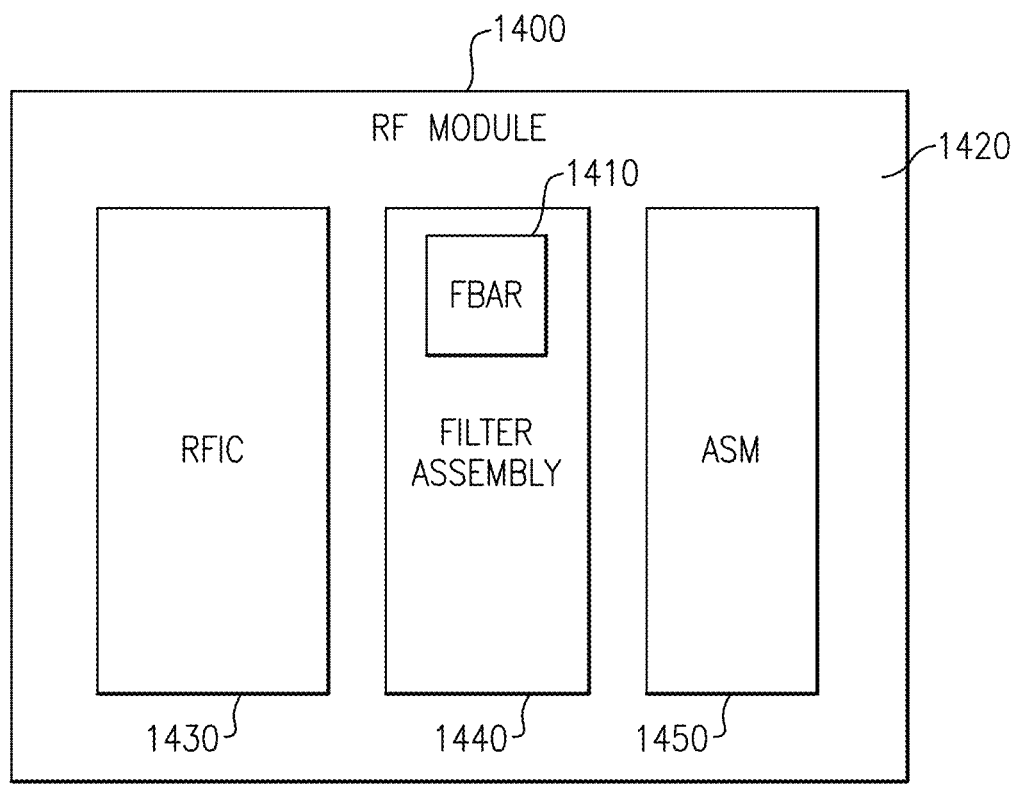
FIG. 14 shows that in some embodiments, an RF module can include a FBAR device having one or more features as described herein.

FIG. 14 shows that an RF module 1400 can include a FBAR device 1410 having one or more features as described herein. In some embodiments, such an RF module can include, a filter assembly 1440, and one or more of the FBAR devices 1410 can provide some or all filtering functionalities for such a filter assembly. In some embodiments, the RF module 1400 can also include, for example, an RF integrated circuit (RFIC) 1430, and an antenna switch module (ASM) 1450. Such an example module can be, for example, a front-end module configured to support wireless operations.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 15:
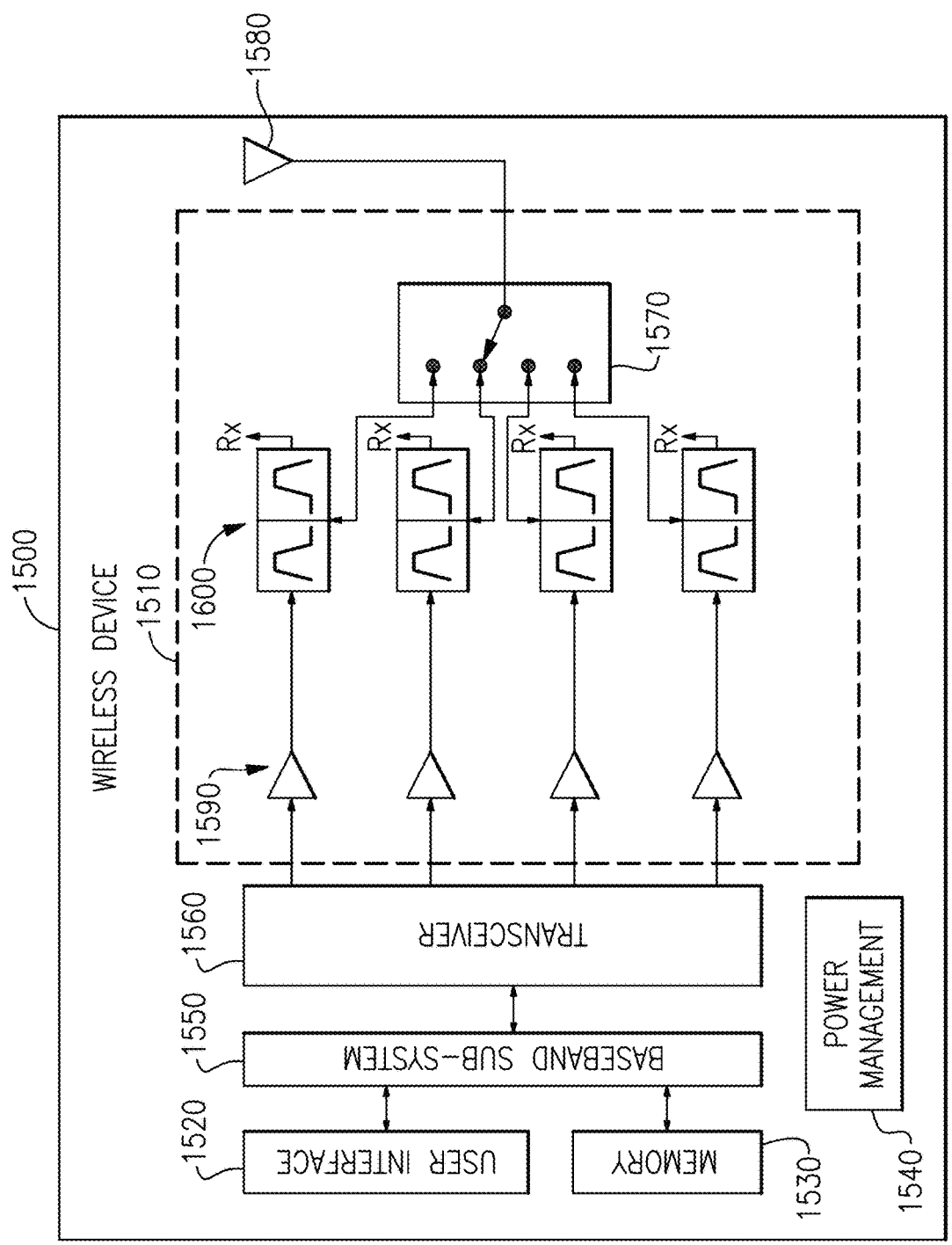
FIG. 15 depicts an example wireless device having one or more advantageous features described herein.

FIG. 15 depicts an example wireless device 1500 having one or more advantageous features described herein. In the context of a module having one or more features as described herein, such a module can be generally depicted by a dashed box 1510, and can be implemented as, for example, a front-end module (FEM). In such an example, one or more FBAR devices as described herein can be included in, for example, an assembly of filters such as duplexers 1600.

Referring to FIG. 15, power amplifiers (PAS) 1590 can receive their respective RF signals from a transceiver 1560 that can be configured and operated in known manners to generate RF signals to be amplified and transmitted, and to process received signals. The transceiver 1560 is shown to interact with a baseband sub-system 1550 that is configured to provide conversion between data and/or voice signals suitable for a user and RF signals suitable for the transceiver 1560. The transceiver 1560 can also be in communication with a power management component 1540 that is configured to manage power for the operation of the wireless device 1500. Such power management can also control operations of the baseband sub-system 1550 and the module 1510.

The baseband sub-system 1550 is shown to be connected to a user interface 1520 to facilitate various input and output of voice and/or data provided to and received from the user. The baseband sub-system 1550 can also be connected to a memory 1530 that is configured to store data and/or instructions to facilitate the operation of the wireless device, and/or to provide storage of information for the user.

In the example wireless device 1500, outputs of the PAs 1590 are shown to be routed to their respective duplexers 1600. Such amplified and filtered signals can be routed to an antenna 1580 through an antenna switch 1570 for transmission. In some embodiments, the duplexers 1600 can allow transmit and receive operations to be performed simultaneously using a common antenna (e.g., 1580). In FIG. 15, received signals are shown to be routed to "Rx" paths (not shown) that can include, for example, a low-noise amplifier (LNA).

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A method for fabricating a film bulk acoustic resonator device, the method comprising:
   forming a first metal layer over a substrate;
   forming a piezoelectric layer;
   forming a second metal layer, the piezoelectric layer positioned between the first and second metal layers, the first metal layer, the second metal layer, and the piezoelectric layer forming an active region; and
   forming a gradient raised frame implemented relative to one of the first and second metal layers and configured to improve reflection of lateral mode waves and to reduce conversion of main mode waves into lateral mode waves, the gradient raised frame including a gradient portion that interfaces with one or more of the first metal layer, the second metal layer, or the piezoelectric layer without passing through the active region.

2. The method of claim 1 wherein the second metal layer is above the piezoelectric layer and the first metal layer is below the piezoelectric layer.

3. The method of claim 2 wherein the gradient raised frame is implemented above the second metal layer.

4. The method of claim 2 wherein the gradient raised frame is implemented below the second metal layer.

5. The method of claim 2 wherein the gradient raised frame has an angle relative to a direction parallel to the first and second metal layers and the piezoelectric layer.

6. The method of claim 5 wherein the angle is less than 90°.

7. The method of claim 6 wherein the angle is less than 45°.

8. The method of claim 7 wherein the angle is less than 30°.

9. The method of claim 2 wherein the gradient raised frame is made of one or more of a heavy material or a low acoustic impedance material.

10. The method of claim 2 further comprising forming a second gradient raised frame implemented relative to one of the first and second metal layers and configured to improve reflection of lateral mode waves and to reduce conversion of main mode waves into lateral mode waves.

11. The method of claim 10 wherein the gradient raised frame is implemented above the second metal layer and the second gradient raised frame is implemented below the second metal layer.

12. The method of claim 10 wherein the gradient raised frame is implemented above the second metal layer and the second gradient raised frame is implemented above the first metal layer.

13. The method of claim 10 wherein the gradient raised frame is implemented below the second metal layer and the second gradient raised frame is implemented below the first metal layer.

14. The method of claim 10 wherein the gradient raised frame and the second gradient raised frame have respective angles relative to a direction parallel to the first and second metal layers and the piezoelectric layer.

15. The method of claim 14 wherein each of the respective angles is less than 90°.

16. The method of claim 15 wherein each of the respective angles is less than 45°.

17. The method of claim 10 wherein the gradient raised frame and the second gradient raised frame are made of one or more of a heavy material or a low acoustic impedance material.

18. The method of claim 17 wherein the gradient raised frame is made of a heavy material and the second gradient raised frame is made of a low acoustic impedance material.

19. The method of claim 2 wherein a passivation layer is implemented above the gradient raised frame.

20. The method of claim 19 wherein the passivation layer includes a recessed frame adjacent to an active region.

* * * * *